US005589783A

United States Patent [19]
McClure

[11] Patent Number: 5,589,783
[45] Date of Patent: Dec. 31, 1996

[54] VARIABLE INPUT THRESHOLD ADJUSTMENT

[75] Inventor: David C. McClure, Carrollton, Tex.

[73] Assignee: SGS-Thomson Microelectronics, Inc., Carrollton, Tex.

[21] Appl. No.: 282,177

[22] Filed: Jul. 29, 1994

[51] Int. Cl.[6] ............................................. H03K 19/0948
[52] U.S. Cl. .............................. 326/71; 326/34; 326/50; 326/81
[58] Field of Search .................................. 326/32, 33, 34, 326/50, 71, 81, 68; 327/513, 525

[56] References Cited

U.S. PATENT DOCUMENTS

| | | | |
|---|---|---|---|
| 4,707,823 | 11/1987 | Bismark | 326/34 |
| 4,806,793 | 2/1989 | Golab | 327/525 |
| 4,857,774 | 8/1989 | El-Ayat et al. | 326/39 |
| 4,929,853 | 5/1990 | Kim et al. | 326/81 |
| 4,988,897 | 1/1991 | Jeong | 326/32 |
| 4,999,529 | 3/1991 | Morgan, Jr. et al. | 326/71 |
| 5,121,014 | 6/1992 | Huang | 327/277 |
| 5,161,124 | 11/1992 | Love | 365/63 |
| 5,304,872 | 4/1994 | Avraham et al. | 326/71 |
| 5,355,033 | 10/1994 | Jang | 326/33 |
| 5,438,280 | 8/1995 | Sugawara | 326/71 |

FOREIGN PATENT DOCUMENTS

| | | |
|---|---|---|
| 58-59628 | 4/1983 | Japan . |
| 1-41521 | 2/1989 | Japan . |
| 2-161817 | 6/1990 | Japan . |
| 3153641 | 2/1993 | Japan . |

*Primary Examiner*—Edward P. Westin
*Assistant Examiner*—Benjamin D. Driscoll
*Attorney, Agent, or Firm*—Theodore E. Galanthay; Lisa K. Jorgenson; Renee M. Larson

[57] ABSTRACT

According to the present invention, an integrated circuit device is capable of responding to more than one input threshold voltage level by making only minimal changes to the device. The input buffer of the integrated circuit device is modified to be a programmable buffer that is controlled by a control input signal which may be generated by several different control means. Such control means include a bond option, a mask option, a fuse option, a register option, and a voltage detector option.

24 Claims, 2 Drawing Sheets

VARIABLE INPUT THRESHOLD ADJUSTMENT

BACKGROUND OF THE INVENTION

The present invention relates generally to integrated circuit devices, and more specifically to integrated circuit devices which may be used in applications having different input voltage thresholds.

There often exists a need to have multiple input voltage thresholds on integrated circuit devices. Integrated circuit devices which may benefit from having multiple input voltage threshold capabilities include memories, logic devices such as PLDs (Programmable Logic Devices), processors such as microprocessors, and gate arrays such as ASICs (Application Specific Integrated Circuits). Such integrated circuit devices may require multiple input voltage threshold capabilities if there exists one or more logic families, such as TTL (Transistor-Transistor Logic) and CMOS (Complementary Metal Oxide Semiconductor), or if it is desirable to maintain voltage levels when switching between voltage standards, such as 5 volts and 3.3 volts.

For many integrated circuit devices, such as microprocessors, there exists two different voltage standards: 5 volts and 3.3 volts. Input voltage levels high, $V_{IH}$, and low, $V_{IL}$, may be defined the same for both voltage standards. For example, the low input voltage level $V_{IL}$ is 0.8 volts while the high input voltage level $V_{IH}$ is 2.2 volts for TTL compatible voltage levels. In addition to TTL compatible levels, CMOS compatible levels may also employ multiple voltage standards. Like TTL, CMOS compatible logic levels also have a $V_{IL}$ and a $V_{IH}$ well known in the art. Thus, it is often desirable to be able to have multiple input voltage thresholds. For example, it would be desirable for an integrated circuit device to be CMOS compatible and TTL compatible at 5 volts, as well as to be CMOS compatible and TTL compatible at 3.3 volts.

Currently, multiple input thresholds for an integrated circuit device are provided by making costly changes to a metal mask of the device. Metal mask changes are costly and time consuming to implement. Therefore, there is a current need in the art for an integrated circuit device to be able to respond to various input voltage thresholds or power supply voltage conditions by making only minimal changes to the integrated circuit device.

SUMMARY OF THE INVENTION

It would be advantageous in the art to make only minimal changes to an integrated circuit device such that the device is capable of responding to multiple input threshold voltage levels or multiple power supply levels which may be supplied to the integrated circuit device.

Therefore, according to the present invention, an integrated circuit device is capable of responding to more than one input threshold voltage level by making only minimal changes to the device. The input buffer of the integrated circuit device is modified to be a programmable buffer that is controlled by a control input signal which may be generated by several different control means. Such control means include a bond option, a mask option, a fuse option, a register option, and a voltage detector option.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

According to the present invention, the input buffer of an integrated circuit device may be modified such that the integrated circuit device is capable of responding to more than one voltage input threshold value or maintaining an input threshold value or trip point across multiple power supply levels. In the art, a trip point is defined such that a voltage above the trip point is interpreted as a high logic level, while a voltage below the trip point is interpreted as a low logic level. A control signal controls the programmable input buffer, and the control signal may be generated by a bond option, a mask option, a fuse option, a register option, or a voltage detector option. Integrated circuit devices which may make use of the present invention include memories, logic devices such as PLDs, processors such as microprocessors, and gate arrays such as ASICs.

Figure 1:
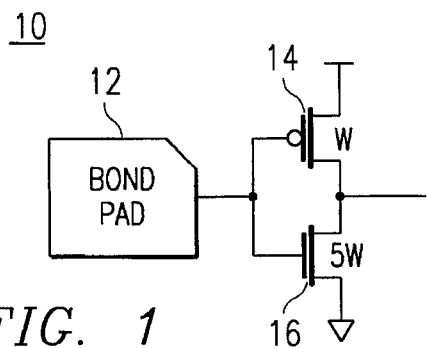
FIG. 1 is a typical TTL input buffer, according to the prior art.

Referring to FIG. 1, a typical TTL input buffer 10, according to the prior art, is shown. TTL input buffer 10 is comprised of a bond pad 12 connected to a p-channel transistor 14 having a width W and a n-channel transistor 16 having a width 5 W, wherein the width of transistor 16 is five times the width of transistor 14. The widths of the transistors of this and subsequent Figures are given as examples of the ratios which may be employed; the widths may vary as a function of the particular integrated circuit device application and the desired trip point of the device. As is well known in the art, a bond pad, such as bond pad 12, typically connects to a package pin of the integrated circuit device.

Figure 2A:
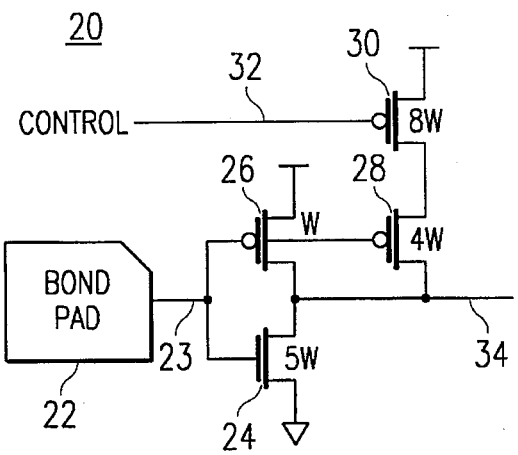
FIG. 2a is a programmable TTL input buffer, according to the present invention.
Figure 2B:
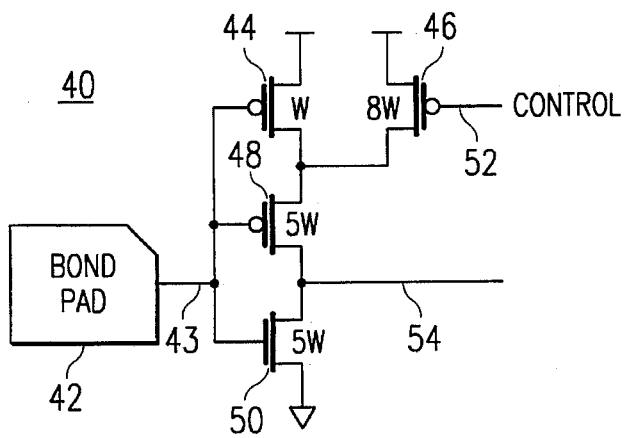
FIG. 2b is a programmable TTL input buffer, according to the present invention.

Referring now to FIGS. 2a and 2b, programmable TTL input buffers 20 and 40, respectively, according to the present invention, are shown. Programmable TTL input buffer 20 of FIG. 2a is comprised of bond pad 22, n-channel transistor 24, p-channel transistor 26, p-channel transistor 28, p-channel transistor 30, and control signal 32. Bond pad input signal 23 feeds the gates of transistors 24, 26, and 28, while control signal 32 feeds the gate of transistor 30, as shown. Transistor 26 has a width W; transistors 24, 28, and 30 each have a width that is five times, four times, and eight times wider than the width of transistor 26, respectively. A first source/drain of transistor 24 is connected to voltage supply Vss, while a first source/drain of transistor 26 and a first source/drain of transistor 30 are connected to voltage supply Vcc. A second source/drain of transistor 24 and a second source/drain of transistor 26 are connected to each other as well as to a first source/drain of transistor 28 to form output signal 34. A second source/drain of transistor 28 and a second source/drain of transistor 30 are connected to each other as shown.

Referring to FIG. 2b, programmable input buffer 40 is comprised of bond pad 42, n-channel transistor 50, p-channel transistors 44, 46, and 48, and control signal 52. Bond pad input signal 43 feeds the gates of transistors 44, 48, and 50, while control signal 52 feeds the gate of transistor 46, as shown. Transistor 44 has a width W; transistors 46, 48, and 50 each have a width that is eight times, five times, and five times wider than the width W of transistor 44, respectively. A first source/drain of each of transistors 44 and 46 is connected to voltage supply Vcc; a first source/drain of transistor 50 is connected to voltage supply Vss. A second source/drain of transistor 44 and a second source/drain of transistor 46 are connected to a first source/drain of transistor 48. A second source/drain of transistor 48 and a second source/drain of transistor 50 are connected to each other and form output signal 54.

The control signal 32 and 52 of FIGS. 2a and 2b, respectively, goes to a low logic level to render a 3.3 volt compatible input trip point of the integrated circuit device, in this example. Control signal 32 or 52 goes to a low logic level and enables an additional parallel path to Vcc through transistors 28 and 30, and 46, respectively, to raise the input trip point. Conversely, control signal 32 and 52 goes to a high logic level for 5 volt compatibility. Control signal 32 and 52 can be based upon a bond option wherein a bond pad of the device which determines the state of the control signal may be physically down-bonded to the device lead frame, a mask option, a fuse option, a register option, or a voltage detector option. The mask option may be implemented by changing the polycrystalline silicon layer of the device to render a 3.3 volt device, for instance. Changing the polycrystalline silicon layer of the device is advantageous if the poly layer is changed to decrease transistor gate length dimensions when moving from the 5 volt to the 3.3 volt standard, because the trip point adjustment and the transistor gate length adjustment may both be accomplished by making a poly mask change. The mask option may also be accomplished by changing a metal layer; however, this approach is advantageous only if it is not also necessary to make a poly layer change to adjust transistor length dimensions or make other device modifications. Otherwise, both a metal layer and a poly layer will have to be changed.

Figure 3:
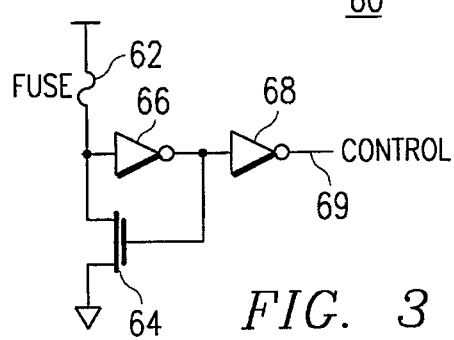
FIG. 3 is fuse circuitry which is illustrative of a fuse option, according to the present invention.
Figure 4:
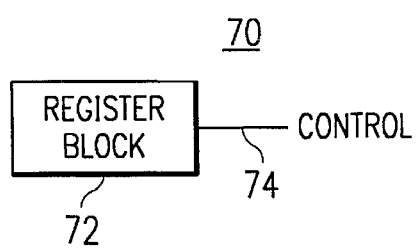
FIG. 4 is a block diagram of a register option, according to the present invention.
Figure 5:
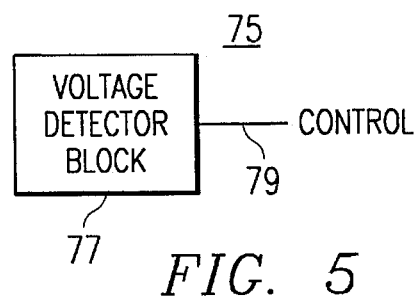
FIG. 5 is a block diagram of a voltage detector option, according to the present invention.

Referring to FIG. 3, the fuse option is illustrated by fuse circuitry 60, according to the present invention. Fuse circuitry 60 is comprised of fuse 62, transistor 64, inverter 66, inverter 68, and generates control signal 69 as an output signal. Fuse 62 is blown to render a 3.3 volt standard. Referring to FIG. 4, a block diagram 70 of the register option is shown. Register circuitry contained within Register block 72 generates control signal 74. The register circuitry may be a latch or a flip flop, for example, and can be loaded by the user. A 0 stored in the register renders 3.3 volt compatibility, and a 1 stored in the register renders 5 volt compatibility. Referring to FIG. 5, a block diagram 75 of the voltage detector option is shown. For instance, voltage detector block 77 contains device supply voltage detector circuitry which generates control signal 79. Voltage detector block 77 may contain a Vcc detector having a trip point of 4 volts, which is between the 3.3 volt standard and the 5 volt standard. When Vcc is greater than 4 volts, control signal 79 is a high logic level, and when Vcc is less than 4 volts, control signal 79 is a low logic level.

Figure 6:
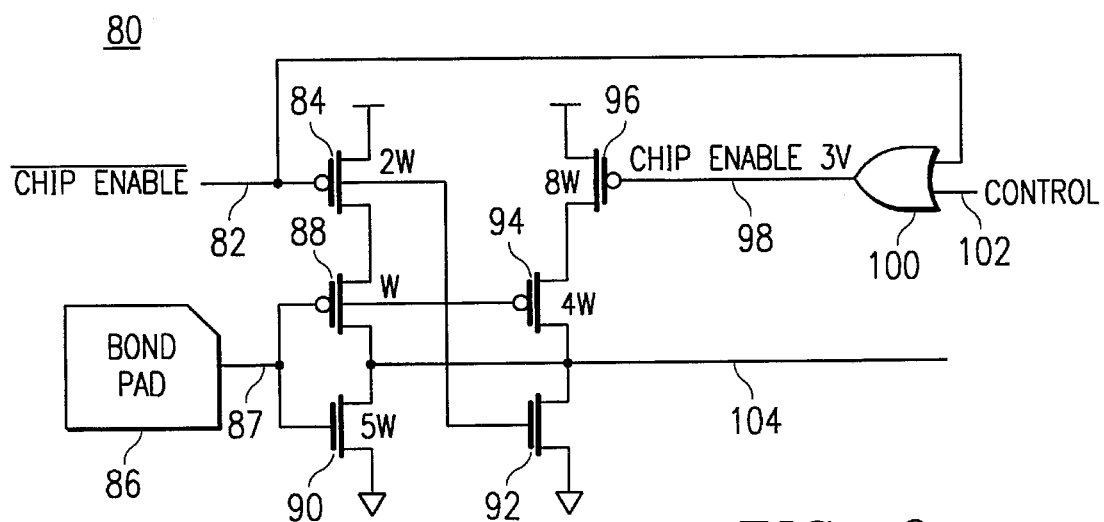
FIG. 6 is a programmable TTL input buffer having a Chip Enable control signal, according to the present invention.

A programmable input buffer of an integrated circuit device may be similarly controlled by a Chip Enable as well as a control signal. Referring to FIG. 6, programmable TTL buffer 80 is comprised of bond pad 86, transistors 84, 88, 90, 92, 94, 96, and OR gate 100. Chip Enable bar input signal 82 controls the gate of transistors 84 and 92. Bond pad input signal 87 of bond pad 86 controls the gates of transistors 88, 90, and 94. Chip Enable 3V signal 98 feeds the gate of transistor 96, and is generated by OR gate 100 which is controlled by Chip Enable bar signal 82 and Control signal 102, as shown. When Vcc is equal to 5 volts, Control signal 102 is a high logic level and thus Chip Enable 3V signal 98 is also a high logic level. Conversely, when Vcc is equal to 3.3 volts, Control signal 102 is a low logic level and thus Chip Enable 3V signal 98 is also a low logic level (assuming Chip Enable bar signal 82 is a low logic level). When Chip Enable bar signal 82 is a high logic level, transistors 84 and 96 are turned off, and transistor 92 pulls output signal 104 low. Transistor 88 has a width of W; transistors 84, 90, 94 and 96 each have a width that is two times, five times, four times, and eight times wider, respectively, than the width W of transistor 88.

A first source/drain of transistor 84 and a first source/drain of transistor 96 are connected to voltage supply Vcc, while a first source/drain of transistor 90 and a first source/drain of transistor 92 are connected to voltage supply Vss. A second source/drain of transistor 84 is connected to a first source/drain of transistor 88. A second source/drain of transistor 88, a second source/drain of transistor 90, a second source/drain of transistor 92, and a second source/drain of transistor 94 are connected to each other and form output signal 104. A first source/drain of transistor 94 is connected to a second source/drain of transistor 96.

The present invention describes various ways the input buffer of an integrated circuit device may be modified to recognize both 3.3 volt standard and 5 volt standard voltage input threshold levels or trip points for both TTL and CMOS compatibility. The present invention may be used to modify the input buffer of various devices, including memories, logic devices, processors, and gate arrays. The present invention makes possible a versatile, multiple Vcc operating point integrated circuit device with correct voltage input threshold levels or trip points. If the mask option is employed, such a device may only require minimal polycrystalline silicon or metal mask changes to render multiple Vcc voltage levels. Additionally, the control based input buffer circuitry allows the user to control the buffer circuitry. Further, device verification, such as testing and Focus-Ion-Beam (FIB) technology to make mask changes, and monitoring of device voltage input levels may be made easier. Also, the present invention, reduces the number of separate parts which must be generated for different Vcc levels or input logic levels; one device, using the present invention, may service more than one voltage standard or set of input logic levels. As an example, one device can be optimized for CMOS compatibility at 3.3 volts and 5 volts and TTL compatibility at 3.3 volts and 5 volts with only minimal device changes or through user control.

While the invention has been particularly shown and described with reference to a preferred embodiment, it will be understood by those skilled in the art that various changes in form and detail may be made therein without departing from the spirit and scope of the invention.

What is claimed is:

1. An integrated circuit device having a variable trip point adjustment, comprising:

a programmable input buffer of an integrated circuit device, wherein the integrated circuit device has a supply voltage; and a control input signal to the programmable input buffer, wherein when the control input signal is equal to a first logic level, a first trip point of the integrated circuit device is defined, and when the control input signal is equal to a second logic level, a second trip point of the integrated circuit device is defined, wherein a chip enable signal of the integrated circuit device may determine whether the control input signal is equal to the first logic level or the second logic level, wherein the programmable input buffer is comprised of a bond pad, a logic gate, a first transistor having a first source/drain, a second source/drain, and a gate, a second transistor having a first source/drain, a second source/drain, and a gate, a third transistor having a first source/drain, a second source/drain, and a gate, a fourth transistor having a first source/drain, a second source/drain, and a gate, a fifth transistor having a first source/drain, a second source/drain, and a gate, and a sixth transistor having a first source/drain, a second source/drain, and a gate; and wherein the chip enable signal controls the gate of the first transistor and the gate of the sixth transistor; wherein a bond pad signal generated by the bond pad controls the gate of the second transistor, the gate of the third transistor, and the gate of the fifth transistor; wherein the chip enable signal is a first input signal to the logic gate, the control input signal is a second input signal to the logic gate, and the logic gate generates a derivative chip enable signal which controls the gate of the fourth transistor; and wherein the first source/drain of the first transistor and the first source/drain of the fourth transistor are connected to a first supply voltage; the second source/drain of the third transistor and the second source/drain of the sixth transistor are connected to a second supply voltage; the second source/drain of the first transistor is connected to the first source/drain of the second transistor; the second source/drain of the second transistor, the first source/drain of the third transistor, the second source/drain of the fifth transistor, and the first source/drain of the sixth transistor are connected together to form an output signal; and the second source/drain of the fourth transistor is connected to the first source/drain of the fifth transistor.

2. A method for variable trip point adjustment of an integrated circuit device, comprising the steps of:

detecting a logic level of a control input signal to a programmable input buffer of an integrated circuit device, wherein the integrated circuit device has a supply voltage; and adjusting a trip point of the programmable input buffer of the integrated circuit device based upon the logic level of the input control signal, wherein when the control input signal is equal to a first logic level, the trip point of the integrated circuit device is adjusted to a first trip point, and when the control input signal is equal to a second logic level, the trip point of the integrated circuit device is adjusted to a second trip point, wherein a chip enable signal of the integrated circuit device may determine whether the control input signal is equal to the first logic level or the second logic level, wherein the programmable input buffer is comprised of a bond pad, a logic gate, a first transistor having a first source/drain, a second source/drain, and a gate, a second transistor having a first source/drain, a second source/drain, and a gate, a third transistor having a first source/drain, a second source/drain, and a gate, a fourth transistor having a first source/drain, a second source/drain, and a gate, a fifth transistor having a first source/drain, a second source/drain, and a gate, and a sixth transistor having a first source/drain, a second source/drain, and a gate; and wherein the chip enable signal controls the gate of the first transistor and the gate of the sixth transistor; wherein a bond pad signal generated by the bond pad controls the gate of the second transistor, the gate of the third transistor, and the gate of the fifth transistor; wherein the chip enable signal is a first input signal to the logic gate, the control input signal is a second input signal to the logic gate, and the logic gate generates a derivative chip enable signal which controls the gate of the fourth transistor; and wherein the first source/drain of the first transistor and the first source/drain of the fourth transistor are connected to a first supply voltage; the second source/drain of the third transistor and the second source/drain of the sixth transistor are connected to a second supply voltage; the second source/drain of the first transistor is connected to the first source/drain of the second transistor; the second source/drain of the second transistor, the first source/drain of the third transistor, the second source/drain of the fifth transistor, and the first source/drain of the sixth transistor are connected together to form an output signal; and the second source/drain of the fourth transistor is connected to the first source/drain of the fifth transistor.

3. A method for variable trip point adjustment of an integrated circuit device, comprising the steps of:

detecting a logic level of a control input signal to a programmable input buffer of an integrated circuit device, wherein the integrated circuit device has a supply voltage; and adjusting a trip point of the programmable input buffer of the integrated circuit device based upon the logic level of the input control signal, wherein when the control input signal is equal to a first logic level, the trip point of the integrated circuit device is adjusted to a first trip point, and when the control input signal is equal to a second logic level, the trip point of the integrated circuit device is adjusted to a second trip point, wherein a chip enable signal of the integrated circuit device may determine whether the control input signal is equal to the first logic level or the second logic level.

4. The method of claim 3, wherein the first trip point is compatible with a 5 volt standard and the second trip point is compatible with a 3.3 volt standard.

5. The method of claim 3, wherein the first trip point is compatible with a TTL (Transistor-Transistor Logic) standard and the second trip point is compatible with a CMOS (Complementary Metal Oxide Semiconductor) standard.

6. An integrated circuit device having a variable trip point adjustment, comprising:

a programmable input buffer of an integrated circuit device, wherein the integrated circuit device has a supply voltage; and a control input signal to the programmable input buffer, wherein when the control input signal is equal to a first logic level, a first trip point of the integrated circuit device is defined, and when the control input signal is equal to a second logic level, a second trip point of the integrated circuit device is defined, wherein a chip enable signal of the integrated circuit device may determine whether the control input signal is equal to the first logic level or the second logic level.

7. The device of claim 6, wherein the first trip point is compatible with a 5 volt standard and the second trip point is compatible with a 3.3 volt standard.

8. The device of claim 6, wherein the first trip point is compatible with a TTL (Transistor-Transistor Logic) standard and the second trip point is compatible with a CMOS (Complementary Metal Oxide Semiconductor) standard.

9. The device of claim 6, wherein the programmable input buffer is connected to a bond pad which is connected to a device pin of the integrated circuit device.

10. The device of claim 6, wherein the input control signal is generated by a control means.

11. The device of claim 10, wherein the control means is a bond option.

12. The device of claim 10, wherein the control means is a mask option.

13. The device of claim 12, wherein the control means is a polycrystalline silicon mask option.

14. The device of claim 12, wherein the control means is a metal mask option.

15. The device of claim 10, wherein the control means is a fuse option having a fuse element and when the fuse element is blown, the input control signal is equal to the first logic level.

16. The device of claim 10, wherein the control means is controlled by a register circuit having a register element and the state of the register element controls the state of the input control signal.

17. The device of claim 10, wherein the control means is controlled by a voltage detector which detects the supply voltage of the integrated circuit device, and wherein when the supply voltage is above a predetermined level, the control input signal is equal to the first logic state, and when the supply voltage is below the predetermined level, the control input signal is equal to the second logic state.

18. The device of claim 6, wherein the integrated circuit device is a memory.

19. The device of claim 6, wherein the integrated circuit device is a logic device.

20. The device of claim 19, wherein the logic device is a Programmable Logic Device (PLD).

21. The device of claim 6, wherein the integrated circuit device is a processor.

22. The device of claim 21, wherein the processor is a microprocessor.

23. The device of claim 6, wherein the integrated circuit device is a gate array device.

24. The device of claim 23, wherein the gate array device is an Application Specific Integrated Circuit (ASIC).

* * * * *